United States Patent
Zhang et al.

(10) Patent No.: US 7,997,754 B2
(45) Date of Patent: Aug. 16, 2011

(54) SOLAR COMPONENT AND DEVICES CONTAINING THE SAME

(75) Inventors: Yazhao Zhang, Shenzhen (CN); Haitao Wang, Shenzhen (CN)

(73) Assignee: BYD Company Limited (CN)

( * ) Notice: Subject to any disclaimer, the term of this patent is extended or adjusted under 35 U.S.C. 154(b) by 295 days.

(21) Appl. No.: 12/472,041

(22) Filed: May 26, 2009

(65) Prior Publication Data

US 2010/0008078 A1    Jan. 14, 2010

(30) Foreign Application Priority Data

Jul. 10, 2008  (CN) ............... 2008 2 0109127 U

(51) Int. Cl.
*F21V 33/00* (2006.01)
(52) U.S. Cl. ......... 362/192; 362/431; 136/246; 136/259
(58) Field of Classification Search .................. 362/192, 362/431; 136/246, 259
See application file for complete search history.

(56) References Cited

U.S. PATENT DOCUMENTS

| | | | | | |
|---|---|---|---|---|---|
| 4,095,997 | A | * | 6/1978 | Griffiths | 136/248 |
| 6,018,123 | A | * | 1/2000 | Takada et al. | 136/248 |
| 6,063,996 | A | * | 5/2000 | Takada et al. | 136/246 |
| 2008/0283113 | A1 | * | 11/2008 | Conger | 136/244 |
| 2010/0001681 | A1 | | 1/2010 | Zhang et al. | |

FOREIGN PATENT DOCUMENTS

CN    201234223    5/2009

* cited by examiner

*Primary Examiner* — Laura Tso
(74) *Attorney, Agent, or Firm* — Greenberg Traurig, LLP

(57) ABSTRACT

Solar component and devices containing the same are disclosed. The solar component includes coupling an upper member, a lower member, and at least two side members to form a cavity for housing a plurality of solar cells. Adjacent solar cells may have unused spaces thereby allowing apertures to be formed therethrough the upper member and the lower member. The apertures are capable of allowing air flow through the cavity thereby leading to reduced wind resistance of the solar component.

20 Claims, 4 Drawing Sheets

SOLAR COMPONENT AND DEVICES CONTAINING THE SAME

CROSS-REFERENCE TO RELATED APPLICATION

This application claims priority to Chinese Patent Application No. 200820109127.7, filed Jul. 10, 2008.

BACKGROUND

In modern society, oil and coal are the main energy resources. However, these non-renewable resources are gradually decreasing and as a result, the prices of oil and coal are steadily increasing. In addition, burning oil and coal is not environmental friendly. Renewable energy resources including the likes of wind, water and solar may be considered as alternatives to oil and coal.

SUMMARY

Solar component and devices containing the same are disclosed. One embodiment discloses a solar component comprising: an upper member; a lower member; at least two side members coupled to the upper member and the lower member, wherein the upper member, the lower member, and the side members are configured to form at least one cavity; at least one solar cell disposed within the cavity, wherein the solar cell is configured to receive sunlight through the upper member; and at least one aperture formed therethrough the upper member and the lower member, wherein the aperture is operable to facilitate air flow through the cavity and the upper and lower members.

In one embodiment, the solar component includes a sealing agent disposed between a portion of at least one of the upper and lower members, wherein the sealing agent isolates the cavity from external environment. In some embodiments, the sealing agent is at least one of adhesive and glass cement. In one embodiment, the aperture is circular. In one embodiment, each solar cell is fabricated of single crystal silicon.

In one embodiment, at least four solar cells are disposed within the cavity, wherein each of the four solar cells comprises at least one angled corner, and wherein the aperture is adjacent to the angled corners. In another embodiment, the angled corner is a chamfer angle, and wherein the chamfer angle is from about 15 to about 45 degrees. In yet another embodiment, at least four solar cells are disposed within the cavity, wherein each of the four solar cells comprises at least one of rounded and recessed corners, and wherein the aperture is adjacent to the rounded and recessed corners.

One embodiment discloses a solar power supply comprising: at least one solar component; a power storage unit coupled to the solar component, wherein the power storage unit is operable to convert sunlight from the solar component into electricity; and a control unit coupled to the solar component and the power storage unit, wherein the control unit is operable to control the power storage unit and the solar component. In one embodiment, the solar power supply includes an output coupled to the power storage unit, wherein the output is operable to deliver electricity to at least one solar-powered device.

One embodiment discloses a solar street lamp comprising: a solar power supply having at least one solar component; a power storage unit, wherein the power storage unit is operable to convert sunlight from the solar component into electricity; and a control unit coupled to the solar component and the power storage unit, wherein the control unit is operable to control the power storage unit and the solar component; and at least one illuminating device connected to the solar power supply, wherein the solar power supply is operable to deliver electricity to the illuminating device. In one embodiment, the illuminating device is a light emitting diode (LED) light.

Other variations, embodiments and features of the presently disclosed solar component and devices containing the same will become evident from the following detailed description, drawings and claims.

DETAILED DESCRIPTION

Figure 1:
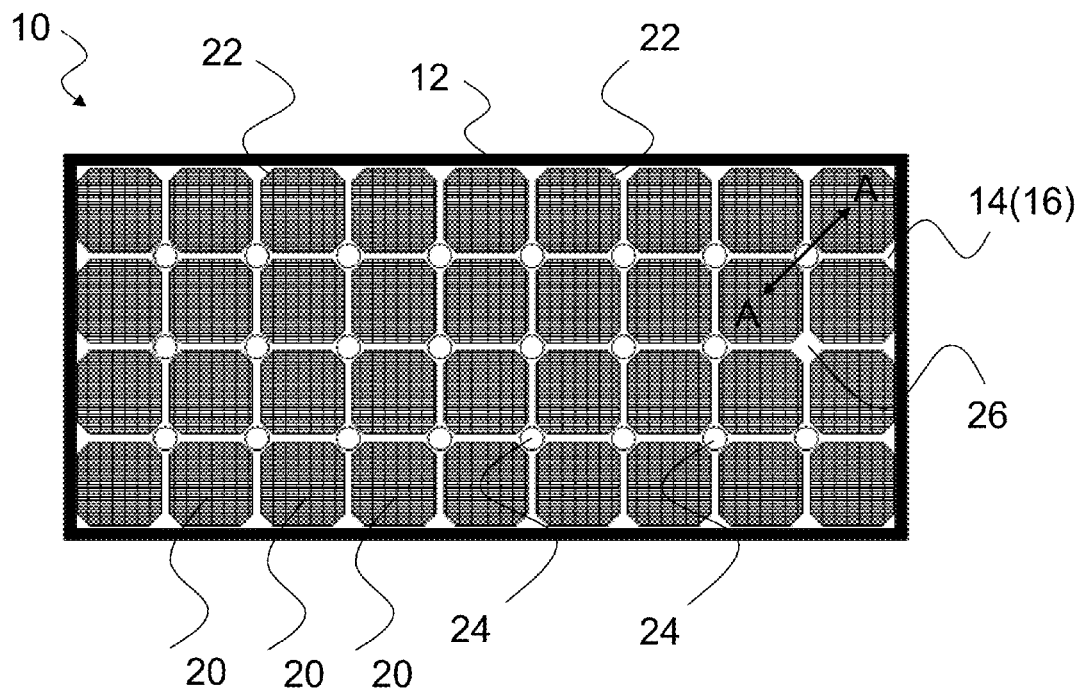
FIGS. 1-2 are top-down and cross-section views, respectively, of a solar component according to one embodiment of the present disclosure.

It will be appreciated by those of ordinary skill in the art that the solar component and devices containing the same can be embodied in other specific forms without departing from the spirit or essential character thereof. The presently disclosed embodiments are therefore considered in all respects to be illustrative and not restrictive. The present disclosure will be described in more details with examples, some parts of the examples are shown in the drawings, whereby the same or similar symbols represent the same components or similar component or functionally similar components. The examples and drawings are used to interpret the present disclosure and shall not be a restriction of the present disclosure.

One embodiment of the present disclosure is to provide apertures therethrough a solar component thereby improving wind resistance without impacting other functions and operations of the solar component and electronic devices using the same. In some embodiments, the electronic devices include without limitation street lamps, water heaters and power supplies.

Example 1

Figure 2:
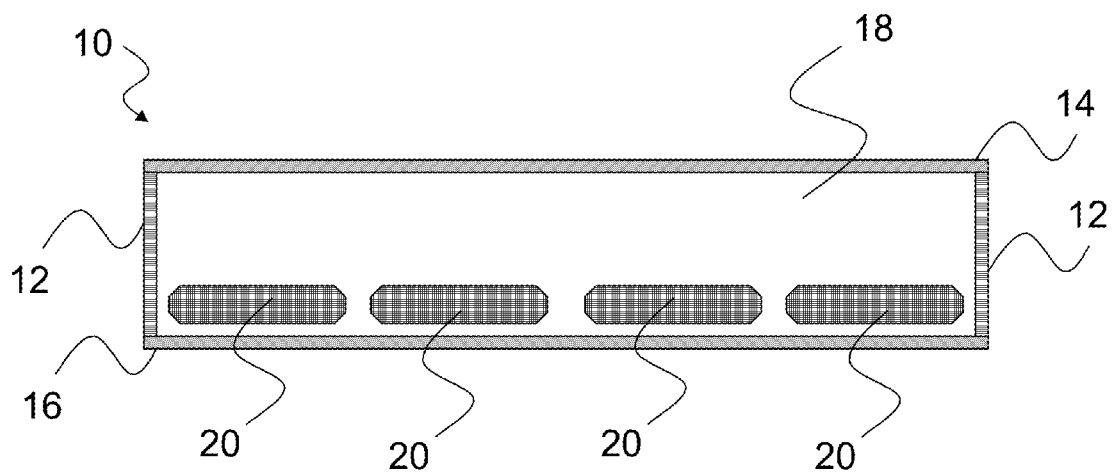

FIGS. 1-2 are top-down and cross-section views, respectively, of a solar component 10 according to one embodiment of the present disclosure. In some instances, the solar component 10 is capable of powering devices including the likes of solar water heaters and solar street lamps, to name a few. In one embodiment, the solar component 10 may be incorporated in a solar power supply. This will become more apparent in subsequent figures and discussion.

In one embodiment, the solar component 10 includes an upper member 14, a lower member 16, and at least two side members 12 coupled to the upper member 14 and the lower member 16 (best shown in FIG. 2). In one example, the upper member 14 is a glass cover. In some examples, the lower member 16 may be a plate or a board. In one instance, the combination of the upper member 14, the lower member 16, and the side members 12 are capable of forming at least one cavity 18. In one example, at least four side members 12 are coupled to the upper member 14 and the lower member 16 in forming the cavity 18.

In one embodiment, at least four solar cells 20 may be disposed within the cavity 18. In some embodiments, there may be more or fewer solar cells 20. For example, the cavity 18 of the solar component 10 may house one solar cell 20, or two solar cells 20, or three solar cells 20, or five or more solar cells 20. The solar cells 20 may be configured to receive sunlight for powering devices including the likes of solar water heater and solar street lamp, to name a few. In one instance, the sunlight may be received through the upper member 14. In one example, the solar cells 20 may be housed within the cavity 18 and enclosed by the upper member 14, the lower member 16, and the side members 12 (best shown in FIG. 2). In one embodiment, the solar cells 20 may be fabricated of single crystal silicon. In some embodiments, the solar cells 20 maybe fabricated of other semiconductor materials including without limitation gallium arsenide and silicon on insulator.

Figures 3A, 3B, 3C:
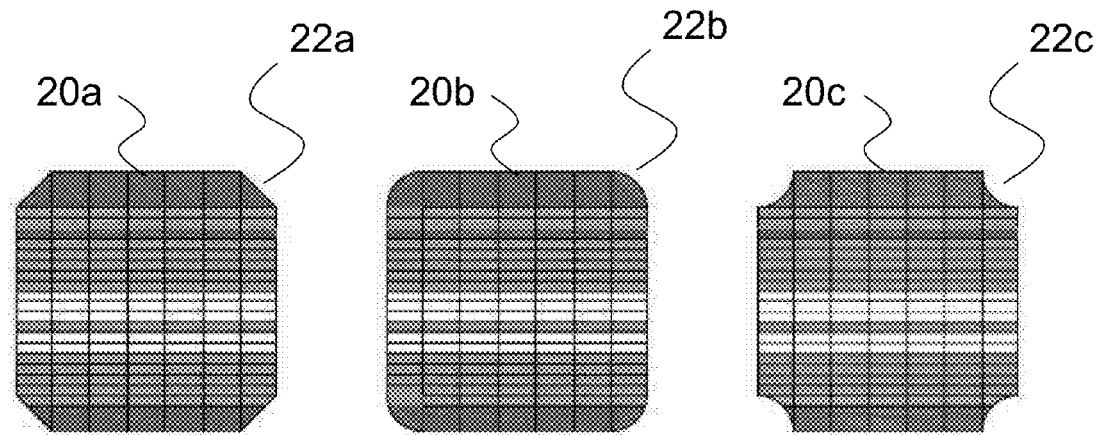
FIGS. 3a-3c are top-down views of three different solar cell configurations.

In one embodiment, each solar cell 20a includes at least one angled corner 22a as best illustrated in FIG. 3a. Alternatively, the angled corner 22a may also be referred to as a chamfer angle, chamfer corner or chamfer angled corner. In some embodiments, the chamfer angle may be at angles of about 15 to about 45 degrees. In other embodiments, the chamfer angle may be at about 20 degrees, or at about 25 degrees, or at about 30 degrees, or at about 35 degrees, or at about 40 degrees, or at about 45 degrees. As shown in FIGS. 1 and 3a, the solar cells 20, 20a may be in the shape of an octagon. In some embodiments, the solar cells 20, 22a may take on other polygonal shapes and sizes including without limitation square, rectangle, diamond and circle (not shown). In one embodiment, four corners 22 of each solar cell 20 within the solar component 10 are at a chamfer angle of about 45 degrees.

In one embodiment, a solar cell 20b may have a rounded corner 22b as shown in FIG. 3b. In another embodiment, a solar cell 20c may have a recessed corner 22c as shown in FIG. 3c. In this instance, the corner is inwardly recessed.

In one embodiment, unused space 26 may exist between adjacent solar cells 20 based on cell configuration. In these instances, at least one aperture 24 may be formed therethrough the upper member 14 and the lower member 16, whereby each aperture 24 is capable of allowing air to flow through the cavity 18. In other words, each aperture 24 penetrates at least a portion of the solar component 10 (e.g., the upper member 14 and the lower member 16). In doing so, air will be able to enter from the upper member 14, through the cavity 18, and exit the lower member 16. Likewise, air will be able to enter from the lower member 16, through the cavity 18, and exit the upper member 14. As used herein, "therethrough" and the like means through it or onto and out of.

In one embodiment, at least four solar cells 20 may be disposed within the solar component 10, wherein the solar cells 20 are arranged in a 2×2 matrix configuration. Because of the unused space 26 between adjacent cells 20 due to the configuration of the corners 22 (e.g., angled, rounded or recessed), an aperture 24 may be formed in the center of the 2×2 matrix adjacent to the corners 22 and surrounded by the four solar cells 20. In another embodiment, apertures 24 may also be disposed on the outer surroundings of the 2×2 matrix adjacent to the corners 22 of each solar cell 20. In other words, by removing at least a portion of a solar cell 20 (e.g., angled, rounded or recessed corners), apertures 24 may be formed in the unused space 26 between adjacent solar cells 20 or around solar cells 20 thereby allowing more solar cells 20 and more apertures 24 to be packed closely within the solar component 10. In some embodiments, the solar cells 20 may be arranged in a 3×3 matrix configuration, or a 4×4 matrix configuration, or a 5×5 matrix configuration, or a 2×3 matrix configuration, or a 2×4 matrix configuration, or a 2×5 matrix configuration, or a 3×4 matrix configuration, or a 3×5 matrix configuration, or a 4×5 matrix configuration. The solar cells 20 of the solar component 10 as shown in FIG. 1 is arranged in a 4×9 or 9×4 matrix configuration.

In one embodiment, prior to coupling the upper member 14 and the lower member 16 to the side members 12, the locations of the solar cells 20 may be preconfigured and the amount of spacing 26 between the solar cells 20 may be predefined in order to determine where to position an aperture 24. In these instances, each aperture 24 may take on various shapes and sizes as formed by drilling or boring techniques with minimal damage to the adjacent solar cells 20. In one embodiment, the aperture 24 may be circular. In some embodiments, the aperture 24 may be rectangular or square, to name a few.

Figure 4:
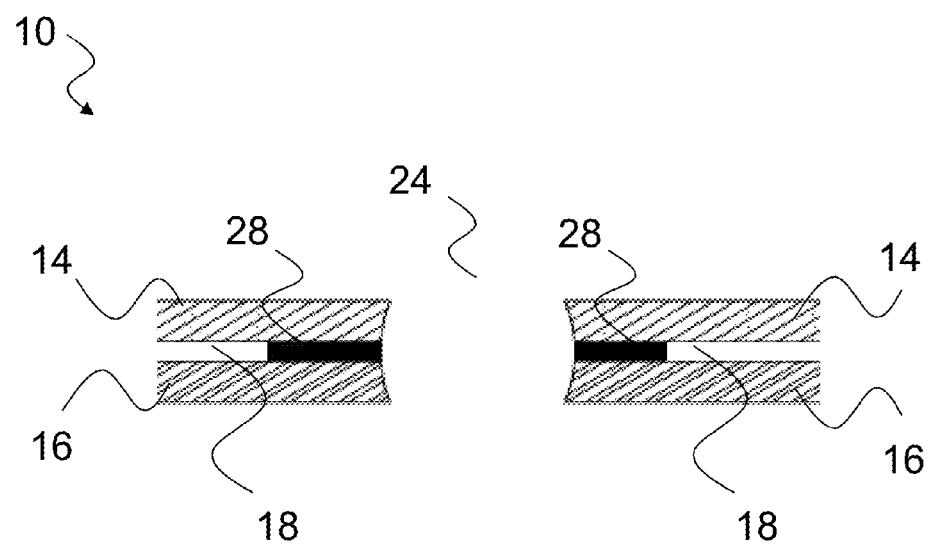
FIG. 4 is a cross-section view through line A-A of the solar component of FIG. 1.

FIG. 4 is a cross-section view through line A-A of the solar component 10 of FIG. 1. As shown, a sealing agent 28 may be incorporated between the upper member 14 and the lower member 16 within each aperture 24. In some embodiments, the sealing agent 28 may include an adhesive or a glass cement, to name a few. The sealing agent 28 may also be other suitable glue or fasteners with anti-aging and water-proofing properties. In one embodiment, the sealing agent 28 is disposed between at least a portion of the upper member 14 and the lower member 16 surrounding the aperture 24 as shown in the figure. The sealing agent 28 may be situated within an interior portion of the aperture 24 coupling the upper member 14 and the lower member 16. The sealing agent 28 effectively seals the sides of the upper member 14 and the lower member 16 without interfering with the operations of the aperture 24. In doing so, the sealing agent 28 is able to separate the cavity 18 from external environment. As a result, the solar cells 20 contained within the cavity 18 may be protected from any harsh or hazardous conditions. In the alternative, the sealing agent 28 is capable of dividing the solar component 10 into a plurality of cavities 18 by isolating each cavity 18 from the apertures 24 and adjacent cavities 18. In one embodiment, the sealing agent 28 may be disposed between the upper member 14 and the lower member 16 surrounding the aperture 24 thereby separating communication between the cavity 18 and the aperture 24.

Example 2

Figure 5:
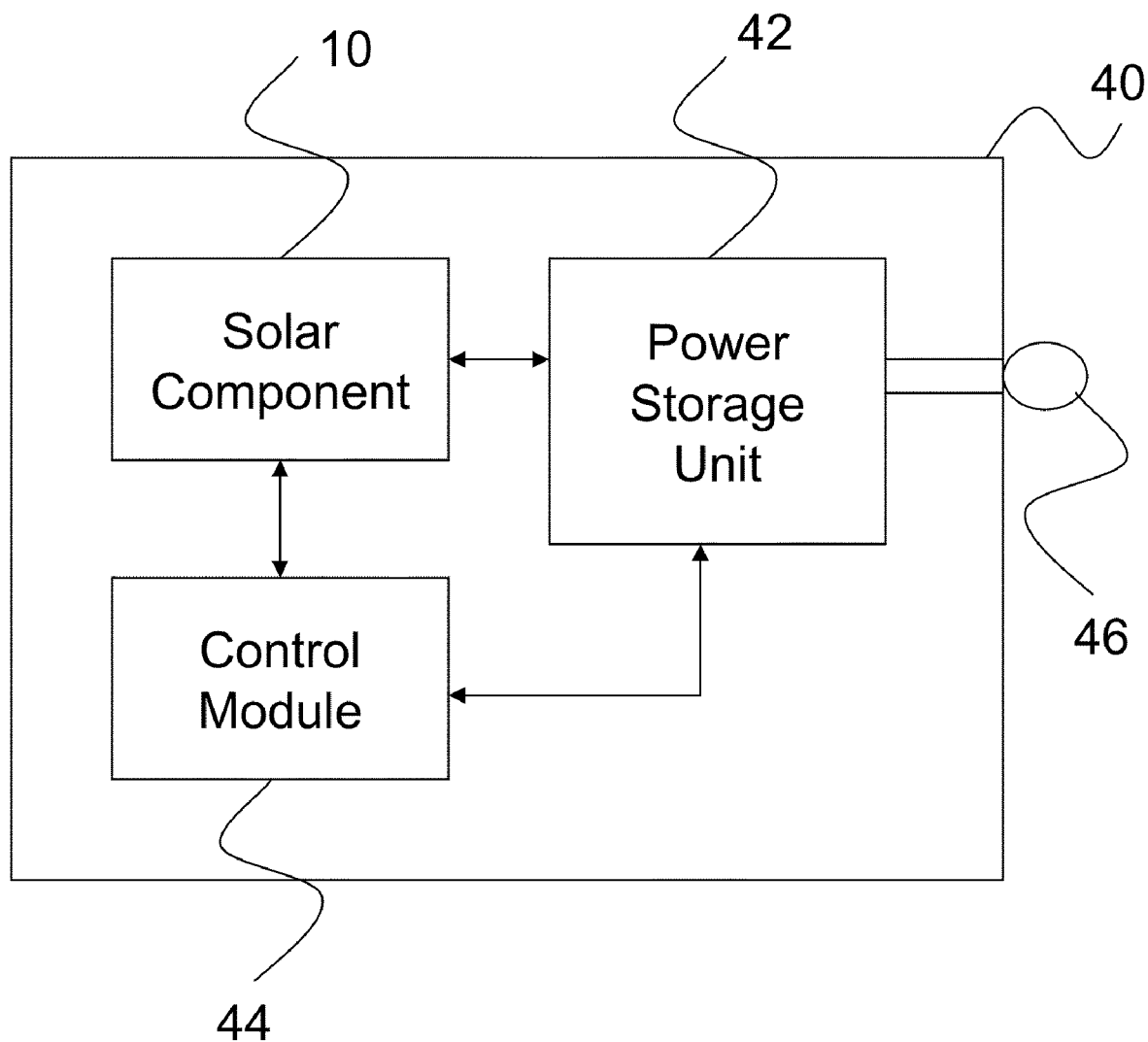
FIG. 5 is a block diagram of a solar power supply according to one embodiment of the present disclosure.

FIG. 5 is a block diagram of a solar power supply 40 according to one embodiment of the present disclosure. The solar power supply 40 includes, among other things, a solar component 10 substantially similar to that described above. In one embodiment, the solar power supply 40 is capable of converting sunlight into electricity.

In one embodiment, the solar power supply 40 also includes a power storage unit 42, which is connected to the solar component 10, and a control unit 44, which is connected to both the power storage unit 42 and the solar component 10. In one embodiment, the control unit 44 is capable of controlling the operations of the solar component 10 and the power storage unit 42. In one embodiment, the power storage unit 42 is capable of converting sunlight from the solar component 10 into electricity, and storing the same within for future use. In one embodiment, the solar power supply 40 also includes an output 46 coupled to the power storage unit 42, whereby the output 46 is capable of delivering electricity to at least one solar-powered device. In some embodiments, the solar-powered device includes without limitation solar water heater and solar street lamp.

In one embodiment, the solar component 10 may be used to collect sunlight through the upper member 14. The collected sunlight may be converted into electricity and stored within the power storage unit 42 for powering external solar-powered devices. The output 46, coupled to the power storage unit 42, offers a path for external solar-powered devices to draw such power from the power storage unit 42 of the solar power supply 40. The conversion and storage of sunlight and electricity, as well as delivery of electricity to external solar-powered devices, may be controlled by the control unit 44. For example, the control unit 44 may prevent the solar component 10 from receiving sunlight or supplying additional power to the power storage unit 42 when the power storage unit 42 has been saturated.

In one embodiment, the solar component 10 includes an upper glass cover board 14, a bottom board 16, and side frames 12 for coupling to the upper glass cover board 14 and the bottom board 16. In one embodiment, the solar component 10 includes at least four silicon solar cells 20 disposed between the upper glass board 14 and the bottom board 16. In this instance, at least one of the silicon solar cell's angled corner is a chamfer angle at about 45 degrees. This may lead to the formation of an unused space 26 in between junctions of adjacent solar cells 20. In one example, each silicon solar cell 20 may have four chamfer angles at about 45 degrees.

In one embodiment, at least one circular aperture 24 may be disposed therethrough the upper glass board 14 and the bottom board 16 thereby penetrating the solar component 10. In one embodiment, an adhesive agent 28 may be disposed onto at least a portion of an inner wall of the aperture 24 between the upper glass board 14 and the bottom board 16 thereby separating the solar cells 20 from the external environment. In one example, the adhesive agent 28 may be glass cement. In other examples, the adhesive agent 28 may have anti-aging or water-proofing properties.

Although the solar component 10, the power storage unit 42, and the control unit 44 are shown as being enclosed within the solar power supply 40, in some instances, at least one of the solar component 10, the power storage unit 42, or the control module 44 may be situated outside of the solar power supply 40. This will become more apparent in subsequent figure and discussion.

Example 3

Figure 6:
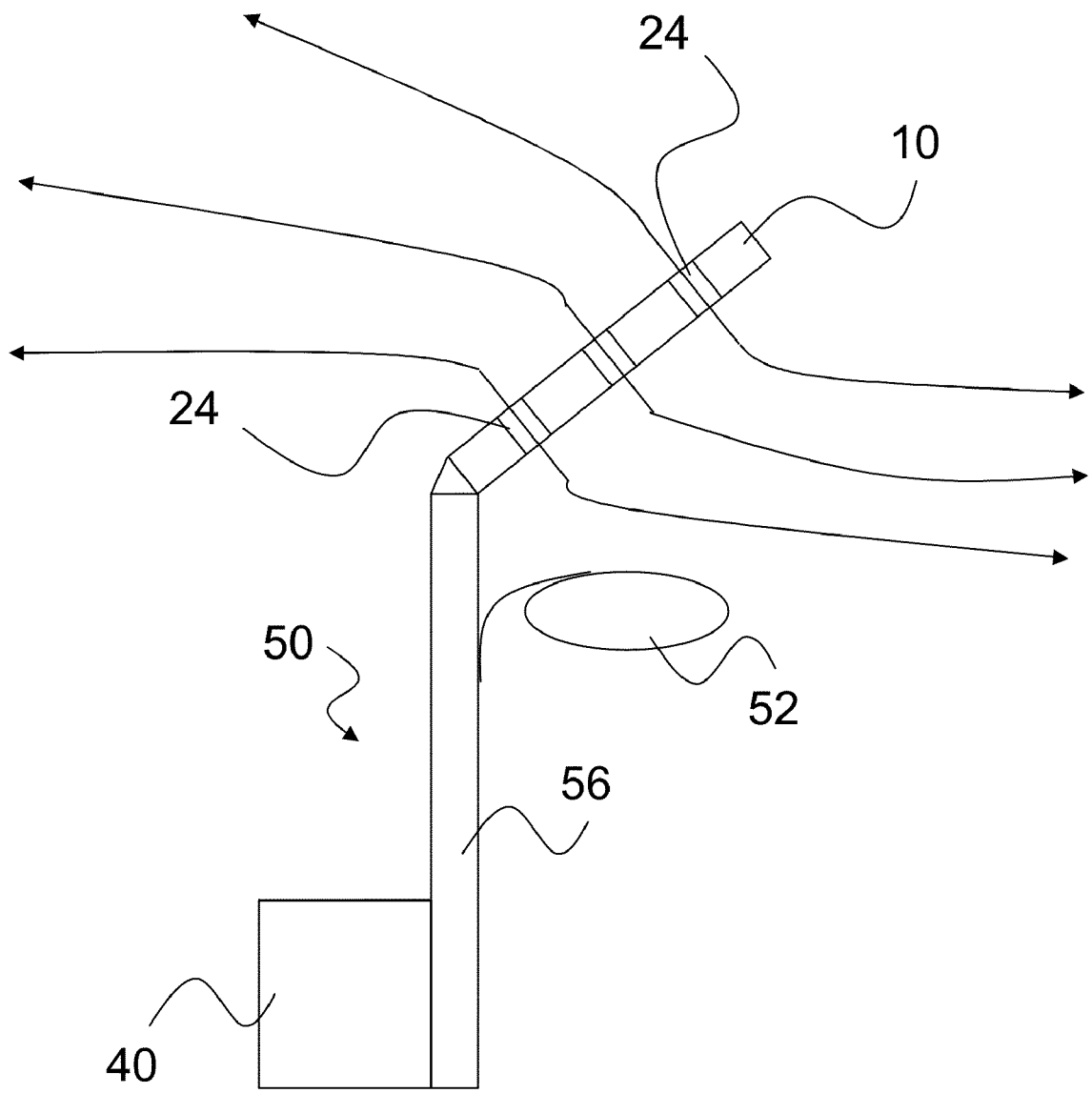
FIG. 6 illustrates a solar street lamp according to one embodiment of the present disclosure.

Reference is now made to FIG. 6 illustrating a solar street lamp 50 incorporating a solar power supply 40 having a solar component 10 according to one embodiment of the present disclosure. In one embodiment, the solar component 10 resides at the top of a lamp post 56 outside of the solar power supply 40 in contrast to the previous example. In one embodiment, the solar power supply 40 and the solar component 10 are substantially similar to those described above and will not be discussed in further detail.

In one embodiment, the solar street lamp 50 includes at least one illuminating device 52 connected to the solar power supply 40. As shown in the figure, the connection may be via electrical wires (not shown) running up and down the lamp post 56. In one embodiment, the illuminating device 52 is a light emitting diode (LED) light. In some embodiments, the illuminating device 52 may include without limitation halogen lamps and light bulbs.

In one embodiment, the solar power supply 40 is capable of transmitting electricity from the power storage unit 42 to the illuminating device 52 similar to that described above. And like above, electricity may be converted and stored within the power storage unit 42 from sunlight received via the solar component 10.

In one embodiment, the apertures 24 within the solar component 10 are able to direct air flow therethrough as shown by the arrows. Accordingly, the presently disclosed solar street lamp 50 may exhibit reduce wind resistance as compared against a solar component 10 without any apertures 24. In one instance, wind resistance may be determined based on the amount of drag or force exerted on the solar component 10. In some embodiments, the reduction in wind resistance may be at least about 5 percent based on the size of the apertures 24. In some instances, the reduction in wind resistance may be at least about 10 percent, or at least about 15 percent, or at least about 20 percent, or at least about 25 percent.

In one embodiment, charging of the solar street lamp 50 may take place during the day for illumination at night. In one example, the solar street lamps 50 may be situated in rural or developing areas without the need for connecting to an external power supply (e.g., without connection to a city or county electrical grid). In some instances, the external environment may be severe and multiple solar cells 20 are needed depending on the illumination intensity and time. In one embodiment, the solar cells 20 for absorbing sunlight are fabricated of silicon and may relatively heavy and occupy a large amount of surface. When positioned at the top of a lamp post 56, the ability of the solar street lamp 50 to withstand wind resistance may become crucial. As such, the benefits of reducing wind resistance using the presently disclosed embodiments may be realized.

Although the solar component and devices containing the same have been described in detail with reference to several embodiments, additional variations and modifications exist within the scope and spirit as described and defined in the following claims.

What is claimed is:

1. A solar component comprising:
   an upper member;
   a lower member;
   at least two side members coupled to the upper member and the lower member, wherein the upper member, the lower member, and the side members are configured to form at least one cavity;
   at least one solar cell disposed within the cavity, wherein the solar cell is configured to receive sunlight through the upper member; and
   at least one aperture formed therethrough the upper member and the lower member, wherein the aperture is operable to facilitate air flow through the cavity and the upper and lower members.

2. The solar component of claim 1, further comprising a sealing agent disposed between a portion of at least one of the upper and lower members, wherein the sealing agent isolates the cavity from external environment.

3. The solar component of claim 2, wherein the sealing agent is at least one of adhesive and glass cement.

4. The solar component of claim 1, wherein the aperture is circular.

5. The solar component of claim 1, wherein each solar cell is fabricated of single crystal silicon.

6. The solar component of claim 1, wherein at least four solar cells are disposed within the cavity, wherein each of the four solar cells comprises at least one angled corner, and wherein the aperture is adjacent to the angled corners.

7. The solar component of claim 6, wherein the angled corner is a chamfer angle, and wherein the chamfer angle is from about 15 to about 45 degrees.

8. The solar component of claim 1, wherein at least four solar cells are disposed within the cavity, wherein each of the four solar cells comprises at least one of rounded and recessed corners, and wherein the aperture is adjacent to the rounded and recessed corners.

9. A solar power supply comprising:
   at least one solar component, wherein the solar component comprises:
      an upper member;
      a lower member;
      at least two side members coupled to the upper member and the lower member, wherein the upper member, the lower member, and the side members are configured to form at least one cavity;
      at least one solar cell disposed within the cavity, wherein the solar cell is configured to receive sunlight through the upper member; and
      at least one aperture formed therethrough the upper member and the lower member, wherein the aperture is operable to facilitate air flow from the upper member, through the cavity, and out the lower member;
   a power storage unit coupled to the solar component, wherein the power storage unit is operable to convert the sunlight from the solar component into electricity; and
   a control unit coupled to the solar component and the power storage unit, wherein the control unit is operable to control the power storage unit and the solar component.

10. The solar power supply of claim 9, further comprising a sealing agent disposed between a portion of at least one of the upper and lower members, wherein the sealing agent isolates the cavity from external environment.

11. The solar power supply of claim 9, further comprising an output coupled to the power storage unit, wherein the output is operable to deliver the electricity to at least one solar-powered device.

12. The solar power supply of claim 9, wherein at least four solar cells are disposed within the cavity, wherein each of the four solar cells comprises at least one angled corner, and wherein the aperture is adjacent to the angled corners.

13. The solar component of claim 12, wherein the angled corner is a chamfer angle, and wherein the chamfer angle is from about 15 to about 45 degrees.

14. The solar component of claim 9, wherein at least four solar cells are disposed within the cavity, wherein each of the four solar cells comprises at least one of rounded and recessed corners, and wherein the aperture is adjacent to the rounded and recessed corners.

15. A solar street lamp comprising:
   a solar power supply comprising:
      at least one solar component, wherein the solar component comprises:
         an upper member;
         a lower member;
         at least two side members coupled to the upper member and the lower member, wherein the upper member, the lower member, and the side members are configured to form at least one cavity;
         at least one solar cell disposed within the cavity, wherein the solar cell is configured to receive sunlight through the upper member; and
         at least one aperture formed therethrough the upper member and the lower member, wherein the aperture is operable to facilitate air flow from the upper member, through the cavity, and out the lower member;
      a power storage unit, wherein the power storage unit is operable to convert the sunlight from the solar component into electricity; and
      a control unit coupled to the solar component and the power storage unit, wherein the control unit is operable to control the power storage unit and the solar component; and
   at least one illuminating device connected to the solar power supply, wherein the solar power supply is operable to deliver the electricity to the illuminating device.

16. The solar street lamp of claim 15, wherein the illuminating device is a light emitting diode (LED) light.

17. The solar street lamp of claim 15, further comprising a sealing agent disposed between a portion of at least one of the upper and lower members, wherein the sealing agent isolates the cavity from external environment.

18. The solar street lamp of claim 15, wherein at least four solar cells are disposed within the cavity, wherein each of the four solar cells comprises at least one angled corner, and wherein the aperture is adjacent to the angled corners.

19. The solar street lamp of claim 18, wherein the angled corner is a chamfer angle, and wherein the chamfer angle is from about 15 to about 45 degrees.

20. The solar street lamp of claim 15, wherein at least four solar cells are disposed within the cavity, wherein each of the four solar cells comprises at least one of rounded and recessed corners, and wherein the aperture is adjacent to the rounded and recessed corners.

* * * * *